(12) United States Patent
Boyle et al.

(10) Patent No.: US 9,730,330 B1
(45) Date of Patent: Aug. 8, 2017

(54) COMPLIANT ELECTRONIC DEVICES

(71) Applicant: H4 Engineering, Inc., San Antonio, TX (US)

(72) Inventors: Christopher T. Boyle, San Antonio, TX (US); Alexander G. Sammons, San Antonio, TX (US); Denes Marton, San Antonio, TX (US); Scott K. Taylor, San Antonio, TX (US)

(73) Assignee: H4 Engineering, Inc., San Antonio, TX (US)

( * ) Notice: Subject to any disclaimer, the term of this patent is extended or adjusted under 35 U.S.C. 154(b) by 238 days.

(21) Appl. No.: 14/550,467

(22) Filed: Nov. 21, 2014

Related U.S. Application Data

(60) Provisional application No. 61/907,364, filed on Nov. 21, 2013.

(51) Int. Cl.
| | | |
|---|---|---|
| H05K 1/18 | (2006.01) |
| H05K 1/11 | (2006.01) |
| H05K 1/02 | (2006.01) |
| H05K 1/03 | (2006.01) |

(52) U.S. Cl.
CPC .......... *H05K 1/189* (2013.01); *H05K 1/0271* (2013.01); *H05K 1/0306* (2013.01); *H05K 1/0393* (2013.01); *H05K 1/186* (2013.01); *H05K 2201/0108* (2013.01); *H05K 2201/10128* (2013.01)

(58) Field of Classification Search
CPC .... H05K 1/189; H05K 1/0271; H05K 1/0306; H05K 1/0393; H05K 1/186; H05K 2201/0108; H05K 1/10128
See application file for complete search history.

(56) References Cited

U.S. PATENT DOCUMENTS

| | | | | |
|---|---|---|---|---|
| 5,476,578 A * | 12/1995 | Forand | ..................... | C25D 5/22 204/207 |
| 7,982,379 B2 | 7/2011 | Krans et al. | | |
| 8,257,129 B2 | 9/2012 | Oh | | |
| 8,883,287 B2 * | 11/2014 | Boyce | ..................... | B29C 59/02 174/254 |
| 2003/0035938 A1 * | 2/2003 | Lai | ......................... | B44C 1/227 428/209 |
| 2003/0072153 A1 * | 4/2003 | Matsui | .................. | F21V 29/004 362/231 |

(Continued)

OTHER PUBLICATIONS

DuPont, DuPont Displays: DuPont Teijin Films PET and PEN Films Fact Sheet, 2009 (available at http://corian.hu/Displays/en_US/assets/downloads/pdf/PET_PEN_Films_FactSheet.pdf).

(Continued)

*Primary Examiner* — Hoa C Nguyen
(74) *Attorney, Agent, or Firm* — Volk & McElroy, LLP; Michael D. Volk, Jr.

(57) ABSTRACT

A compliant electronic device is presented. The device may be, for example a wearable display for sports applications. The compliant electronic device comprises a thin sheet with a regular pattern of openings optimized to provide maximum compliance. The device may be partially or completely embedded in foam or other highly stretchable and compressible material that, while preserving compliance, protects the device from untoward environmental influences.

12 Claims, 15 Drawing Sheets

(56) References Cited

U.S. PATENT DOCUMENTS

| | | | | |
|---|---|---|---|---|
| 2004/0124763 | A1* | 7/2004 | Nathan | H01L 27/3244 313/498 |
| 2008/0218369 | A1* | 9/2008 | Krans | A47G 9/1045 340/691.1 |
| 2010/0002402 | A1* | 1/2010 | Rogers | H01L 21/4867 361/749 |
| 2011/0279545 | A1* | 11/2011 | Osaki | B41J 2/1404 347/44 |
| 2013/0100053 | A1 | 4/2013 | Kang et al. | |
| 2014/0000944 | A1* | 1/2014 | Tanabe | H05K 1/0274 174/255 |
| 2014/0165269 | A1* | 6/2014 | Aleksov | A41D 31/00 2/250 |

OTHER PUBLICATIONS

DuPont, DuPont Teijin Films: Melinex ST Stabilized Polyester Films, 2007.

Han, Sarah, Core Issues in Flexible Display Technique, SEMI, Mar. 3, 2009 (available at http://www.semi.org/en/IndustrySegments/FPD/ctr_028618).

Ober, Christopher K, Substrates, MSE5420 Flexible Electronics, 2008 (available at http://people.ccmr.cornell.edu~cober/MSE5420/page2/files/iNEMISubstrateFlex0808.pdf).

Ordaz, Sung & Young, Barry, OLEDs and Flexible Displays, date of publication unknown (available at http://www.oled-a.org/images/pdfs/OLEDs%20and%20Flexible%20Displays.pdf).

Parlex Corporation, Flexible Circuit Dielectric Base Material Options, date of publication unknown (available at http://www.parlex.com/tech_library/BaseMAT.pdf).

Suzuki et al., All-printed Organic TFT Backplanes for Flexible Electronic Paper, International Symposium on Electronic Paper 2010, 2010 (available at https://www.ricoh.com/ja/technology/tech/pdf/idw10paper.pdf).

* cited by examiner

COMPLIANT ELECTRONIC DEVICES

CROSS-REFERENCE TO RELATED APPLICATIONS

This application claims the benefit of U.S. Provisional Patent Application No. 61/907,364, filed Nov. 21, 2013, titled "COMPLIANT ELECTRONIC DEVICES", the content of which is hereby incorporated by reference in its entirety and is not admitted to be prior art with respect to the present invention by the mention in this cross-reference section.

BACKGROUND

This invention relates to flexible electronics. Flexible circuit boards for electronic applications are well known and widely used. Recently, flexible displays have been developed using a variety of technologies. Some flexible displays may be bent and even rolled up along a single direction, while in the perpendicular direction these displays are rigid. Other flexible displays may be bent in any direction but even these displays are bendable only in one direction at a time. If they are bent in two directions, points of high (theoretically infinite) strain develop at intersections of bending axes.

One of the motivations behind the drive for flexible electronics in general and flexible displays in particular is that wearable electronic products could be used during activities, like sports. However, a flexible display made using current technologies is much more like a sheet of paper than like a piece of cloth; it may be bent but it is not geometrically compliant. Improvements in the design of flexible displays are necessary to make them wearable devices, among other uses.

SUMMARY OF THE INVENTION

In accordance with a preferred embodiment hereof, this invention provides a compliant electronic device comprising: a substrate having a top side and a bottom side, said substrate made of flexible material and said substrate having an array of openings that extend from said top side to said bottom side and comprising an array of electronic parts attached to said substrate in the areas between said array of openings. And, it provides such a compliant electronic device also comprising an insulating member having a top side and a bottom side, wherein said insulating member fills in gaps between the electronic parts and wherein said insulating member is made of stretchable and compressible material. Further, it provides such a compliant electronic device wherein a display screen is attached to the top side of said insulating member and wherein said display screen has a top side and a bottom side and also comprises an array of regularly arranged openings that extend from said top side to said bottom side. Still further, it provides such a compliant electronic device comprising a second substrate having a top side and a bottom side, said second substrate being made of flexible material and said second substrate having an array of openings that extend from said top side to said bottom side and comprising an array of electronic parts attached to said second substrate in the areas between said array of openings. Even further, it provides a compliant electronic device wherein one substrate is made of piezoelectric material and the array of electronic parts can cause the piezoelectric material to locally bend the device in a particular programmable shape. Yet further, it provides a compliant electronic device wherein a substrate is made of piezoelectric material and the array of electronic parts can detect any local strain of the piezoelectric substrate. And, it provides such a compliant electronic device wherein the electronic devices attached to one of the substrates are pixel size rechargeable batteries. Further, it provides such a compliant electronic device wherein said device has a top surface and a bottom surface, said surfaces being substantially parallel and their distance of separation being small compared to the sizes of said top surface and bottom surface and wherein said top surface and said bottom surface are formed by a highly stretchable and compressible polymer that fills up substantially the space between said top surface and said bottom surface. And, it provides such a compliant electronic device wherein said device has a top surface and a bottom surface, said surfaces being substantially parallel and their distance of separation being small compared to the sizes of said top surface and bottom surface and wherein said top surface comprises a display screen and said bottom surface is formed by a highly stretchable and compressible polymer that fills up substantially the space between said top surface and said bottom surface. Even further, it provides a compliant electronic device wherein said device has a top surface and a bottom surface, said surfaces being substantially parallel and their distance of separation being small compared to the sizes of said top surface and bottom surface and wherein said top surface and said bottom surface are formed by a highly stretchable and compressible polymer that fills up substantially the space between said top surface and said bottom surface. And, it provides such a compliant electronic device wherein said device has a top surface and a bottom surface, said surfaces being substantially parallel and their distance of separation being small compared to the sizes of said top surface and bottom surface and wherein said top surface comprises a display screen and said bottom surface is formed by a highly stretchable and compressible polymer that fills up substantially the space between said top surface and said bottom surface.

In accordance with another preferred embodiment hereof, this invention provides a stretchable display for an electronic device comprising a bendable substrate having a top side and a bottom side, a multiplicity of regularly arranged pixel size light emitting electronic devices attached to said bendable substrate and located between said top side and bottom side, wherein said light emitting electronic devices constitute pixels of a picture visible from the top side and a multiplicity of regularly arranged openings connecting said top side and said bottom side. And, it provides such a stretchable display wherein the regularly arranged openings are made in a staggered slot pattern. Further, it provides such a stretchable display wherein the regularly arranged openings are made in a pattern of square openings oriented such that the edges of each square opening form substantially 45 degree angle with the edges of any neighboring square opening. Still, it provides such a stretchable display comprising two bendable substrates, wherein the nearest neighbor light emitting electronic devices attached to each of said bendable substrates form squares and wherein the light emitting devices on said two bendable substrates in combination form a pixel arrangement wherein the nearest neighbor pixels are located at the vertexes of squares. Still further, it provides such a stretchable display comprising two bendable substrates, wherein the nearest neighbor light emitting electronic devices attached to each of said bendable substrates form rectangles and wherein said rectangles have a short side and a long side and wherein the long side is about twice as long as the short side and wherein the light emitting devices on said two bendable substrates in combination form a pixel arrangement wherein the nearest neighbor pixels are located at the vertices of squares.

In accordance with another preferred embodiment hereof, this invention provides a wearable electronic device wherein said device comprises a patchwork of substantially flat electronic devices as patches and wherein said patches are attached to a cloth-like backing and interconnected by wiring that runs along said backing and wherein the patches have borders that define their shapes and are shaped such that they fill up a plane and such that the borders are oriented in at least three substantially different directions. And, it provides such a wearable electronic device wherein the patches are further characterized by having a thickness and the distances between the patches as they are attached to said backing are about the same as the thicknesses of the patches. Further, it provides such a wearable electronic device wherein the patches are shaped hexagonally. And, it provides such a wearable electronic device having octagonal and square shaped patches.

DETAILED DESCRIPTION

Figure 1:
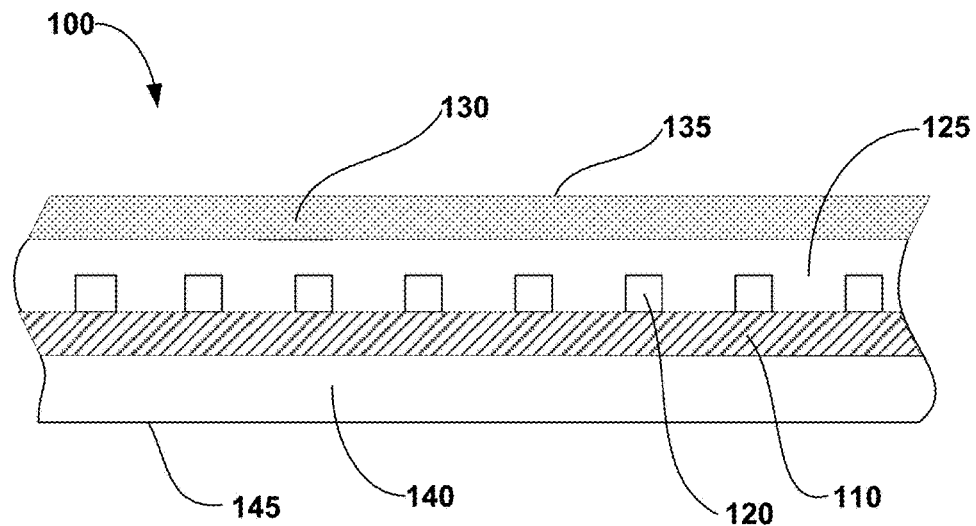
FIG. 1 is a cross sectional view of a part of a flexible display.

Automatic video recording of participants in sporting activities opens the door for applying such video recording as a training tool. Instant replay of activities viewed by the trained person could significantly enhance the usefulness of this tool since the recorded information would be utilized while the corresponding experience is fresh in the mind. At least one impediment to the instant replay by the person engaged in a sporting activity is that current display devices are typically rigid and carrying such devices may impede the very activity in which the person is being trained. Further, carrying such display devices may even pose a danger, for example, if the person falls and lands on the display device.

Lightweight compliant displays could potentially be worn attached to clothing. However, currently existing flexible displays are not wearable and we contend that wearable displays should be stretchable and compressible for this purpose. Although the motivation behind this work is the creation of wearable displays, the design principles and embodiments described herein are applicable to other electronic devices and displays, beyond wearable displays.

The present invention is based in part on the recognition that it is acceptable to sacrifice picture quality to some extent if the result is a geometrically compliant wearable display. The user of a wearable display is interested, for example, in reviewing a play just executed on a football field. In such application, the user will not be bothered by minor imperfections of the picture, as long as the essential information is conveyed by the device. Inferior picture quality may be a reasonable tradeoff if the display is more comfortable or convenient to wear, and even more so if the issue is whether the display may be worn at all. The reason why picture quality must be sacrificed to some extent for the sake of the display being compliant is that, according to the preferred embodiments described herein, to make a display stretchable and compressible, one has to allow for small gaps between its parts. The gaps may be executed in many different ways as shown and described herein, and hence there are numerous possible embodiments of this invention.

A second recognition on which the present invention is based is that the Li-po (lithium-polymer) battery technology is compatible with providing battery that is fully integrated with the inventive display. Such fully integrated battery may be produced in the form of a thin sheet attached to the display, or even used as the backing layer, or substrate, of the display. Current display and battery technology makes it possible to produce displays that are only 0.3 mm thick. The thickness of the battery sheet for an hour of playtime may be as little as 0.2-0.3 mm.

The device thus created is essentially a 0.5-0.6 mm thick sheet with an appropriate pattern of openings for compliance and it may be connected using just a few leads to a unit that comprises a central processing unit (CPU) for control, an antenna for radio communication, and a charging connector.

This invention was made in part utilizing the experience of developing bendable electronic devices for an automated video recording system; see co-owned U.S. patent application Ser. No. 13/784,536, titled "Multifunction Automatic Video Recording Device" which is incorporated herewith by reference in its entirety.

According to a preferred embodiment hereof, the present invention comprises a compliant electronic device comprising a substrate having a top side and a bottom side, said substrate being made of flexible material and said substrate having an array of openings that extend from said top side to said bottom side and comprising an array of electronic parts attached to said substrate in the areas between said array of openings. According to yet another preferred embodiment hereof, the present invention comprises a stretchable display for an electronic device comprising a bendable display having a top side and a bottom side, a multiplicity of regularly arranged pixel size light emitting electronic devices attached to a flexible substrate and located between said top side and bottom side that contribute to a picture visible from the top side and a multiplicity of commensurate size and regularly arranged openings connecting said top side and said bottom side.

According to yet another preferred embodiment hereof, the present invention provides a geometrically compliant electronic device comprising a top side and a bottom side, a bendable substrate between said top side and bottom side and a variety of electronic parts attached to the bendable substrate. For further discussion of the present invention, when the adjective "compliant" is used, it is understood that the geometrical compliance is meant. The compliant devices considered by the present invention (displays and others) are substantially sheet-like objects, having sizes in two dimensions (i.e., in the plane of the object) that are large in comparison to their size in the third dimension. A difference between bendable and compliant objects is that compliant objects are also stretchable and compressible along the plane of the object, while bendable object are essentially not stretchable or compressible, except for the stretching and compression that results from bending. The inventive devices described herein typically comprises a display as a user interface, in which case the electronic parts attached to a bendable substrate comprise light emitters, wherein said light emitters constitute a pixelated display. The bottom side of the device may be able to stick to surfaces, like clothing, due to its mechanical, chemical, or electro-magnetic properties.

According to still another preferred embodiment hereof, the present invention provides a stretchable display for an electronic device comprising a bendable display having a top side and a bottom side and a multiplicity of regularly arranged openings that extend from the top side to the bottom side. The display also comprises a bendable substrate with a multiplicity of regularly arranged pixel size light emitting electronic devices attached to the flexible substrate. The flexible substrate together with the electronic devices attached to it are located between the top side and bottom side of the display and contribute to a picture visible from the top side, or from both sides, and also comprises a multiplicity of regularly arranged openings that extend from the top side to the bottom side.

According to another preferred embodiment hereof, this invention provides a woven display assembly for electronic devices comprising a flexible frame and two sets of stretchable displays, wherein each set comprises a multiplicity of stretchable display strands, and wherein said strands are one or several pitch size in width and have the length when not stretched to connect opposite sides of the frame and are interwoven with one another, and wherein said strands constitute a quasi-continuous display surface within said frame.

According to yet another embodiment hereof the openings between the top side and bottom side of the device are larger than a pixel. Such, relatively large openings provide excellent compliance and two of such displays may be placed on top of each other but shifted such that both pixel arrays are visible at the same time. Appropriately programmed, the two display layers together provide a sufficiently high pixel density for acceptable picture quality.

All of the embodiments described above may be combined with providing a distributed battery layer for powering the device and also serving as the backing layer for the pixel architecture.

FIG. 1 shows the schematic structure of a cross section of flexible electronic device 100. Flexible electronic device 100 has a layered structure, wherein the layers comprise a top layer 130 (or front layer) and a bottom layer 140 (or rear layer). Flexible substrate 110, together with a variety of attached electrical components 120, is embedded into foam layer 125. Substrate 110 is preferably a highly flexible and elastic, electrically insulating polymer that may be metallized in portions such that electrical connections to components 120 can be made. Preferably the top or front layer 130 of device 100 is a touchscreen with touchable surface 135. Alternatively, and in particular in the case of devices other than displays, front layer 130 may be branded foam (foam that may have a pattern on its surface, see, for example FIG. 11A) indicating button locations and clear areas for LED visibility. Preferably the bottom or rear layer 140 is made of a material that, while flexible, also can serve to attach device 100 to a surface. For this purpose, bottom surface 145 may be adhesive, Velcro, a magnetic sheet, or a surface that clings to smooth insulating surfaces by virtue of electrostatic attraction.

Figure 2:
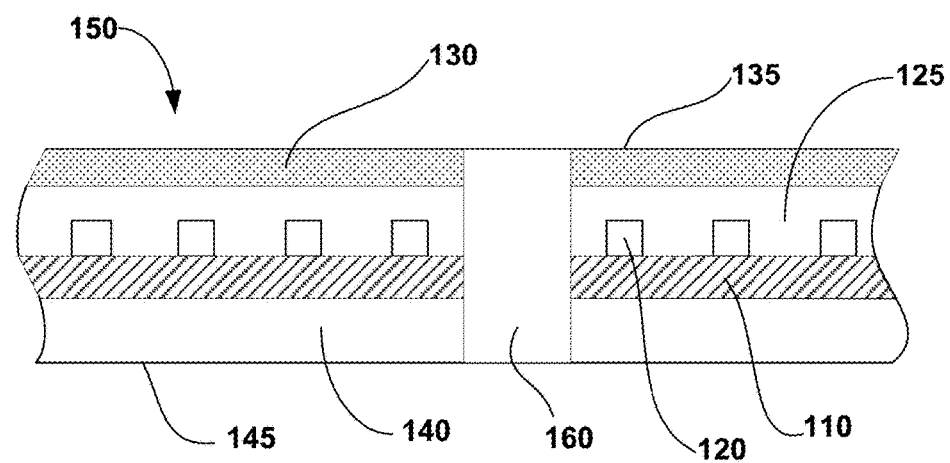
FIG. 2 is a cross sectional view of a part of a first embodiment of a compliant display according to a preferred embodiment of the present invention.

FIG. 2 shows the schematic cross section of a compliant electronic device 150 according to a preferred embodiment of the present invention. The difference between compliant electronic device 150 and the device shown in FIG. 1 is that compliant electronic device 150 comprises opening 160 that extends between the front surface 135 and the rear surface 145. Openings 160 are preferably distributed in a pattern along the layered structure of the device 150.

Figure 3:
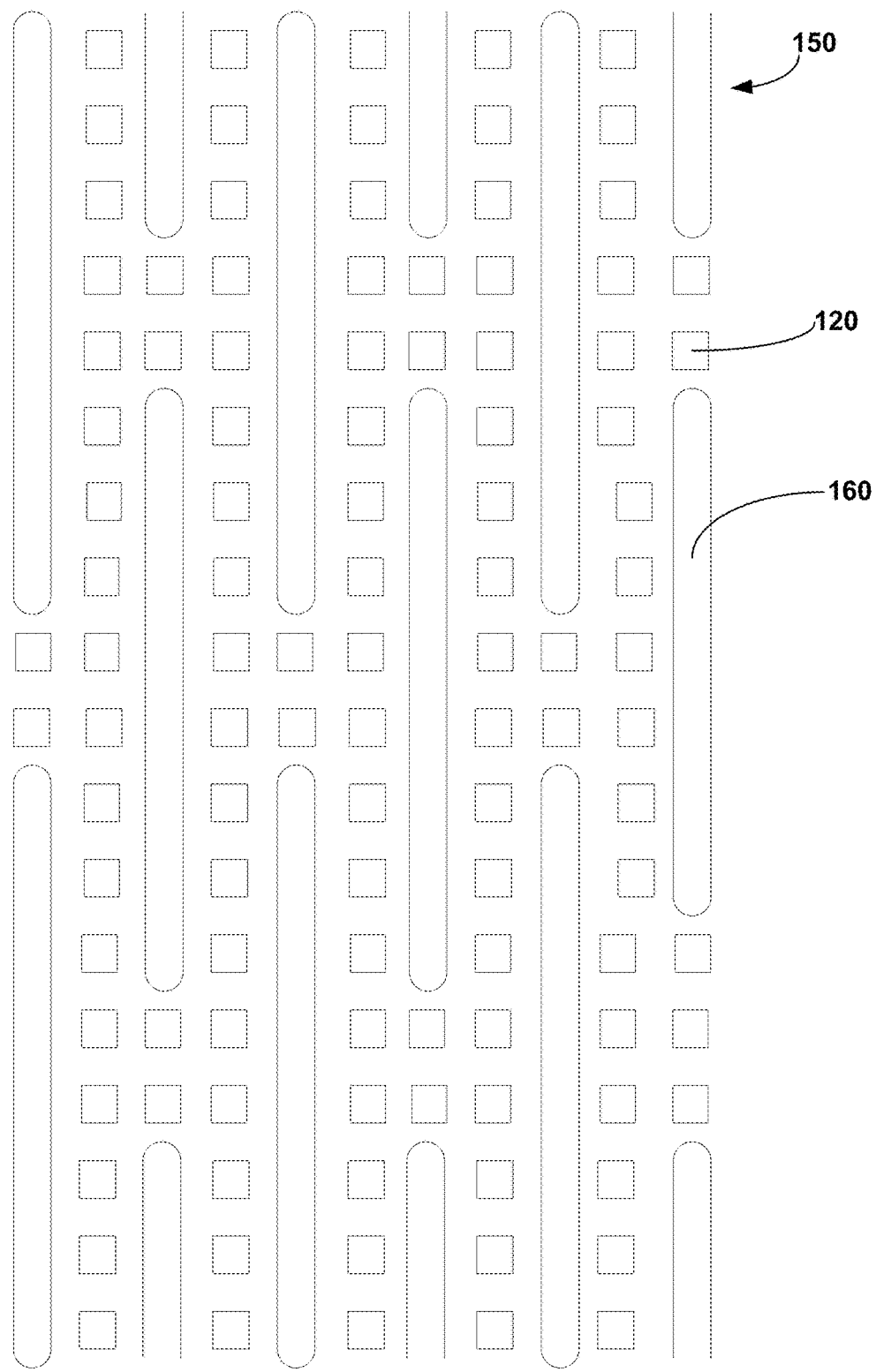
FIG. 3 is a schematic representation of a part of the top view of a preferred embodiment of a compliant display according to a preferred embodiment of the present invention.

A schematic top view of a part of compliant electronic device 150 is shown in FIG. 3. In this view, it is assumed that layers 125 and 130 (see FIG. 1 and FIG. 2) are sufficiently transparent for attached electrical components 120 to be visible. The number of attached electrical components 120 shown in each figure is arbitrary and the actual number of attached electrical components between openings 160 may vary depending on a particular design. The size and shape of openings 160 is also design dependent. The staggered slot pattern shown in FIG. 3 is one preferred design.

Figure 4:
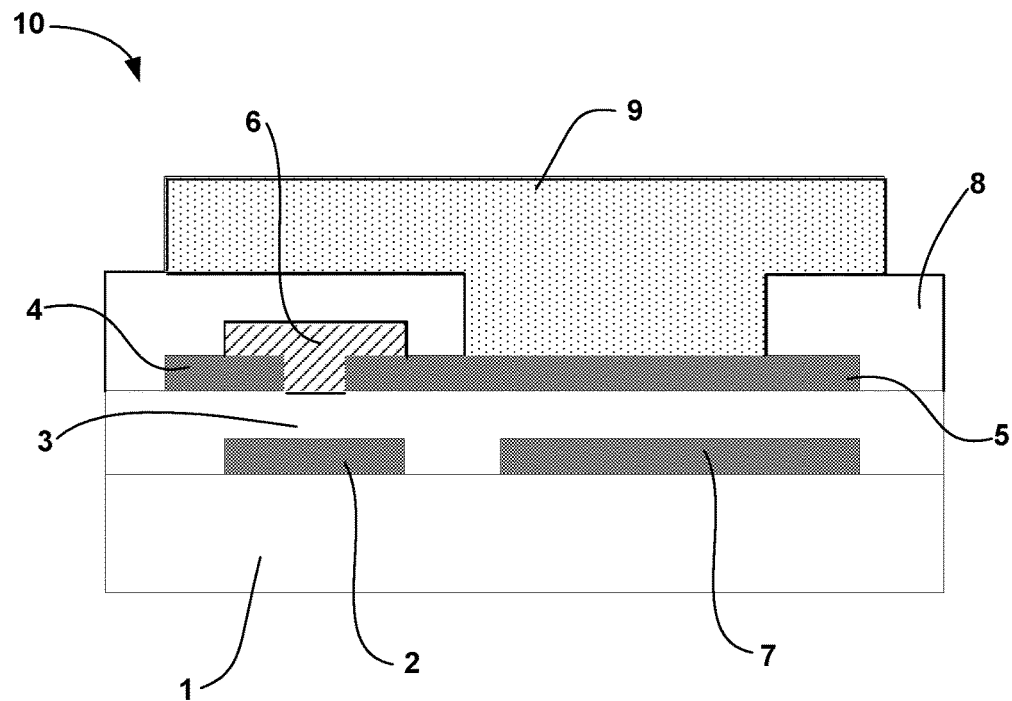
FIG. 4 is a cross sectional view of a pixel of a compliant display.

FIG. 4 is a schematic cross section of an organic thin film transistor (OTFT) used in some flexible displays. In this design, the display pixel is represented by the pixel electrode 9. The pixel is built on substrate 1; the TFT comprises gate electrode 2, gate insulator 3, and source and drain electrodes 4 and 5, respectively. The pixel is controlled by the transistor via storage capacitor 7. The pixels are separated by insulator 8. A flexible display of this or similar type may have the following characteristics: about 60×60 μm² pixel size, about 230 μm pitch (distance between the centers of two adjacent pixels) and about 0.3 mm total thickness. An exemplary 4.3" 640×240 pixel display uses 0.3 W power while playing a video.

Figure 5:
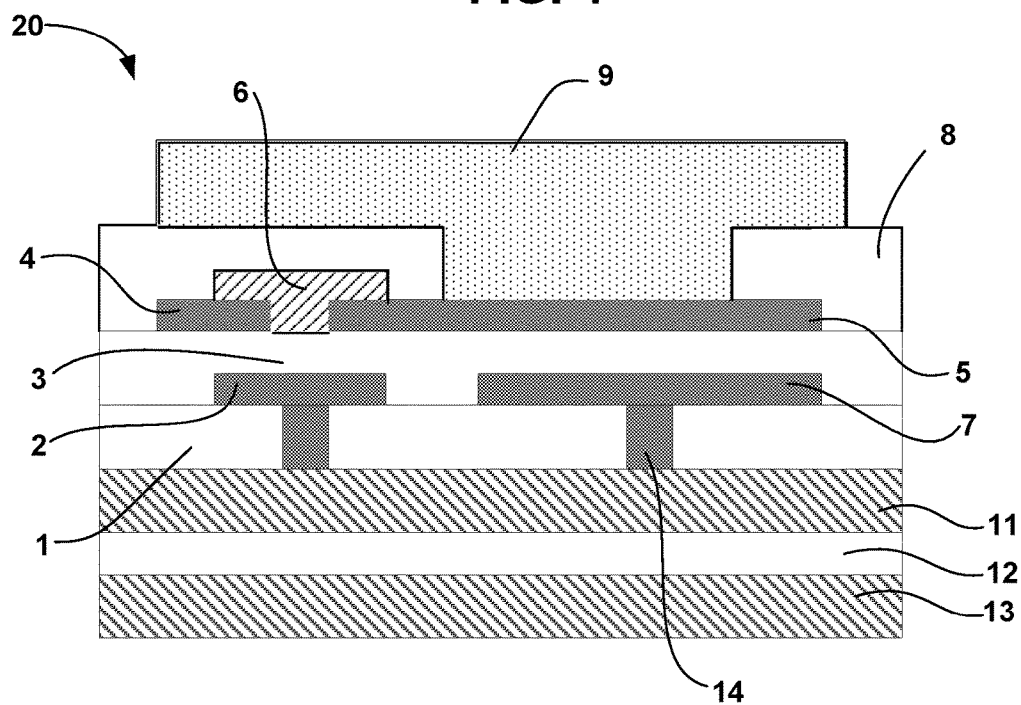
FIG. 5 is a cross sectional view of a pixel of a compliant display having a battery design according to a preferred embodiment of the present invention.

FIG. 5 shows a schematic cross section of the same OTFT and pixel shown in FIG. 4 but in this figure a battery design according to a preferred embodiment of the present invention replaces part of substrate 1 of FIG. 4. The battery is represented by cathode and anode 11 and 13, respectively and by solid electrolyte 12. As shown in FIG. 9, each pixel electrode is connected to a battery that powers the associated pixel electrode. Each of the batteries associated with each pixel electrode are connected to power the display. Each of the batteries is preferably rechargeable. As shown in FIG. 5, each of the rechargeable batteries is the size of a pixel. Also shown is connector 14 that provides power to the source of the TFT. A contemporary Li-polymer (LiPo) battery provides a power density of about 170 J/kg or about 0.23 J/cm³. Considering the display power requirement, a 0.3 mm thick battery layer of the inventive design will support about 1 hour of playtime.

Figure 6:
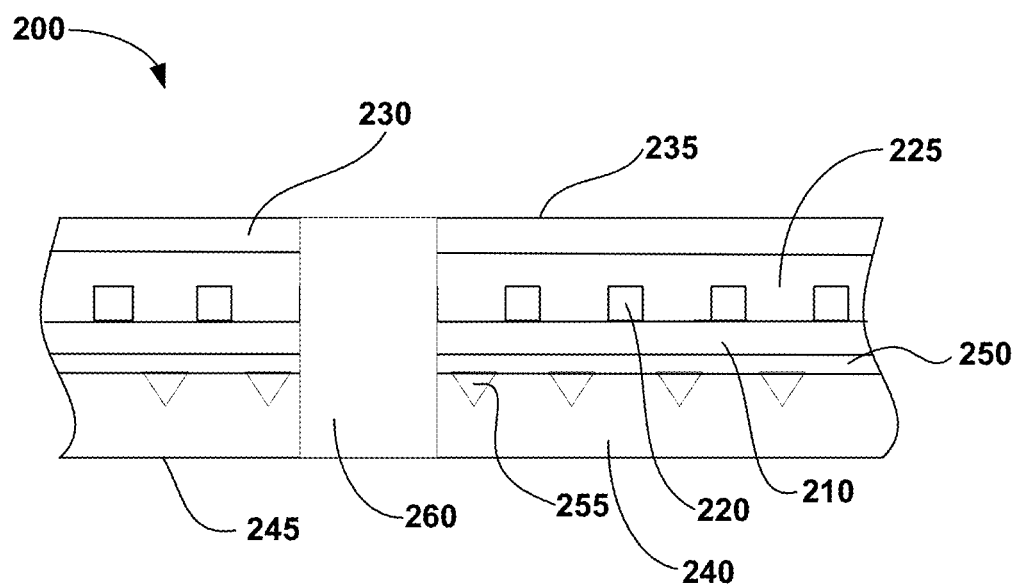
FIG. 6 is a cross sectional view of a part of a second embodiment of a compliant display according to a preferred embodiment of the present invention.
Figure 7A:
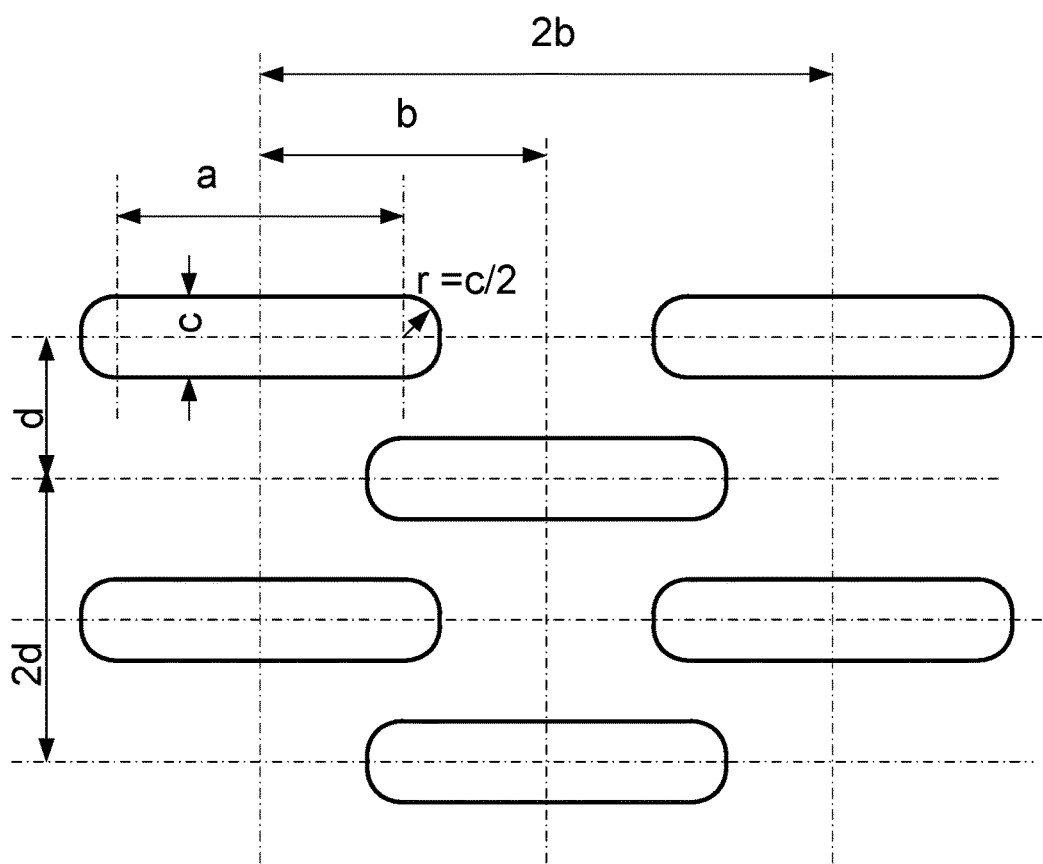
FIG. 7A is a schematic representation of the top view of a slot pattern design of the inventive display, wherein the meanings of the notations used in FIG. 7B are shown.
Figure 7B:
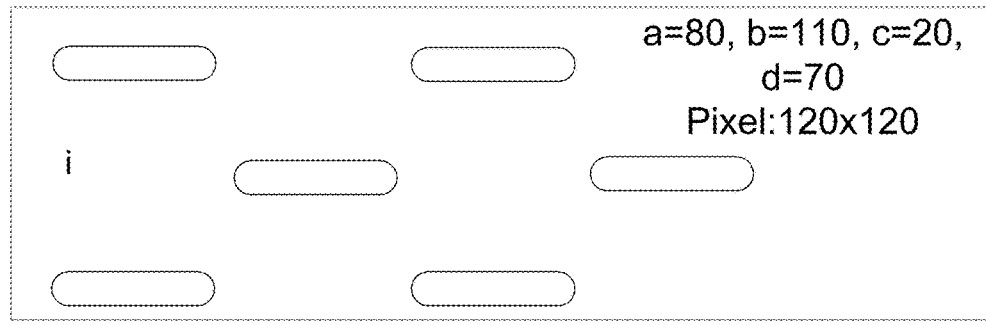
FIG. 7B is a schematic representation of three slot pattern design variations for compliant displays according to preferred embodiments of the present invention.
Figure 7B:
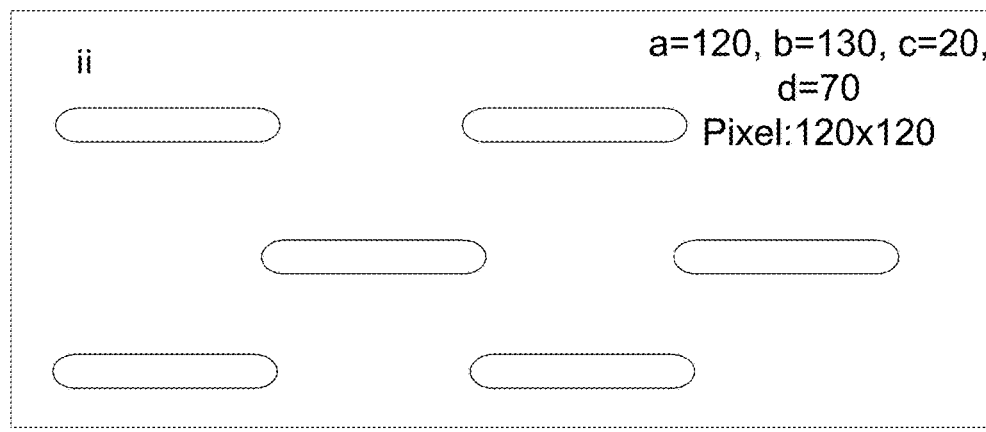
Figure 7B:
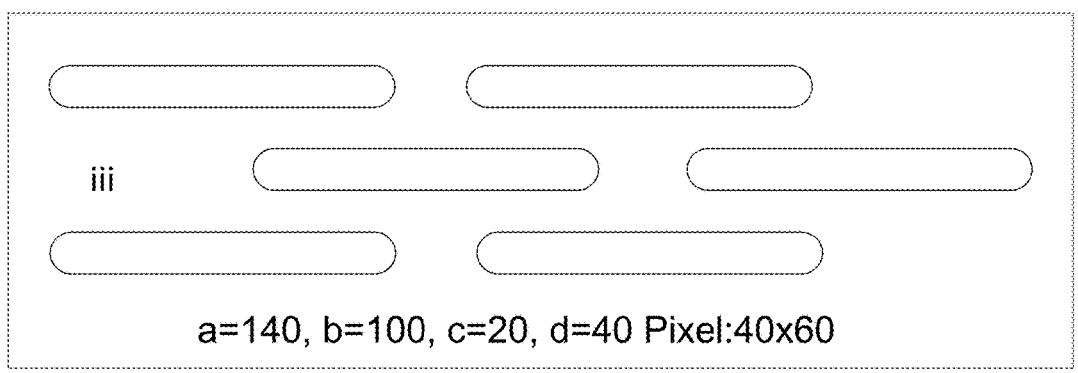

FIG. 6 shows the schematic structure of a cross section of another preferred embodiment of a compliant display 200. Display 200 has layered structure, (similar to display 100, FIG. 1) wherein the layers comprise a top (front) layer 230 and a bottom (rear) layer 240. Flexible substrate 210, together with a variety of attached electrical components 220, is embedded into foam layer 225. Substrate 210 is preferably a highly flexible and elastic, electrically insulating polymer that may be metallized in portions such that electrical connections to components 220 can be made. Preferably the top or front layer 230 of display 200 is a touchscreen with touchable surface 235. Preferably, the bottom or rear layer 240 is made of a material that, while flexible, also can serve to attach screen 200 to a surface. For this purpose, bottom surface 245 may be adhesive, Velcro, or magnetic sheet, or a sheet that clings to smooth insulating surfaces by virtue of electrostatic attraction. In addition, display 200 comprises a piezoelectric layer 250 and an array of piezoelectric sensors 255. When display 200 is bent, sensors 255 detect the local strain. Information retrieved from sensors 255 is used to correct the picture by adjusting feature size in the picture for dilatation (or compression) of the display surface. Slots 260 (similar to 160 in FIG. 2) are included to make the display compliant. The compliant electronic device that is made with a substrate of piezoelectric material can also have an array of electronic parts that can cause the piezoelectric material to locally bend the device in a particular programmable shape. Additionally, the array of electronic parts can detect any local strain of the piezoelectric substrate FIG. 7A is a schematic representation of the top view of a slot pattern design of the inventive display, wherein the meanings of the notations used in FIG. 7B are shown. FIG. 7B is a schematic representation of three slot pattern design variations for compliant displays according to preferred embodiments of the present invention.

FIG. 7A is a schematic representation of a staggered slot pattern with the notations of the parameters that may be varied in order to experimentally optimize the mechanical properties of the patterned material. In addition to experiments, FEA (Finite Element Analysis) methods may be employed to optimize the slot pattern.

A few slot pattern variations are shown in FIG. 7B (pattern i, pattern ii, and pattern iii), where the geometrical characteristics (a, b, c, d, and the pixel size) are provided in relative units.

Figure 8A:
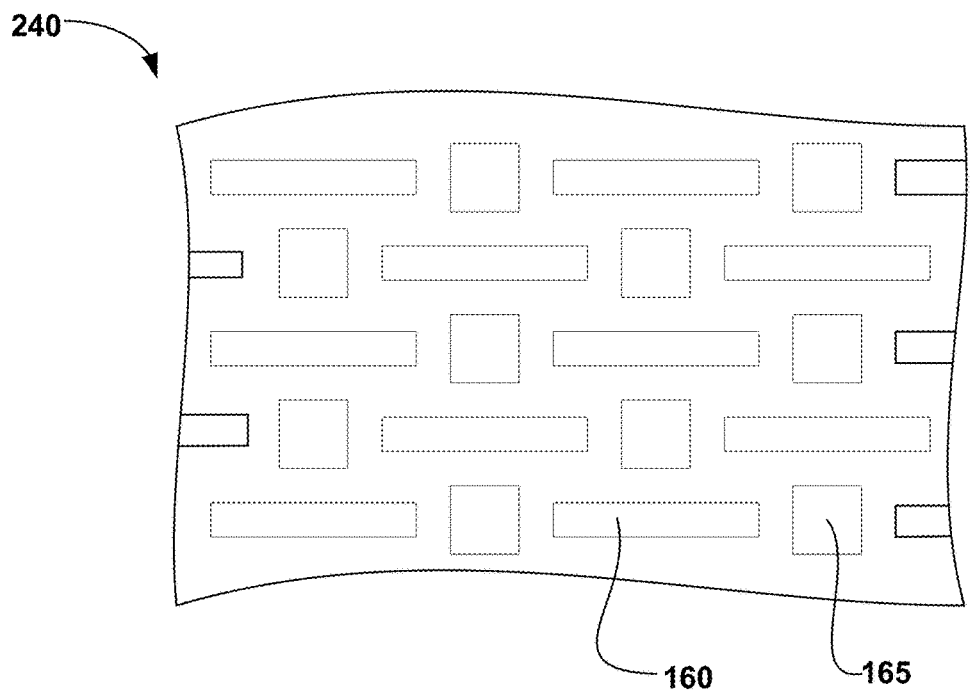
FIG. 8A is a schematic representation of the top view of an alternative embodiment of slot pattern design for the inventive display according to a preferred embodiment of the present invention.
Figure 8B:
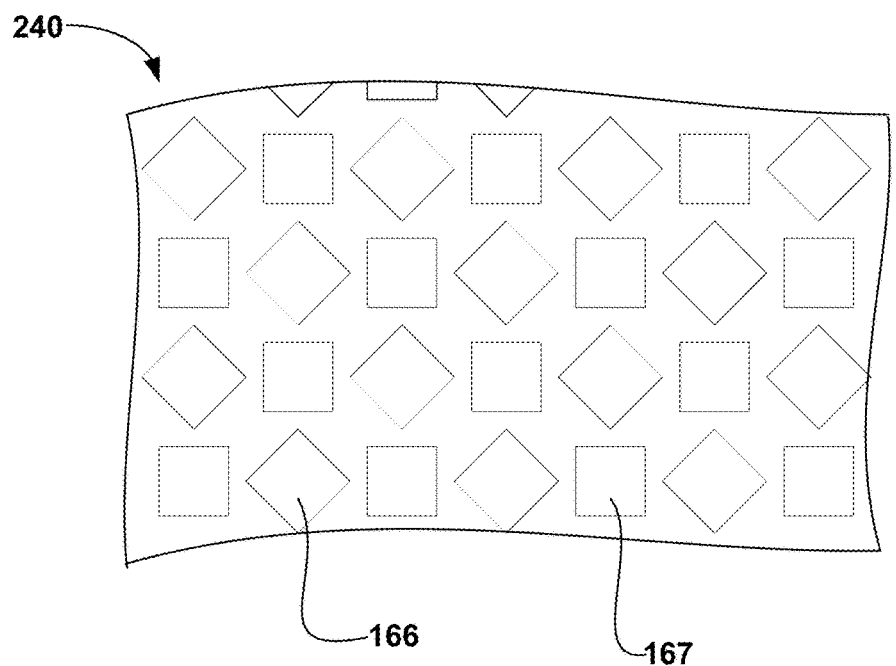
FIG. 8B is a schematic representation of the top view of yet another alternative embodiment of a pattern design for the inventive display according to a preferred embodiment of the present invention.

A staggered slot pattern is not the only conceivable pattern that may be useful for creating compliant electronic devices. As an example, a different contemplated slot pattern is shown schematically shown in FIG. 8A. In FIG. 8A, flexible sheet 240 is shown as patterned with an array of staggered slots 160 together with a second array of openings 165. In FIG. 8B a flexible sheet 240 is shown as patterned with alternating arrays of openings 166 and 167. In FIG. 8B, the openings are made in a pattern of square openings oriented such that the edges of each square opening form substantially 45 degree angle with the edges of any neighboring square opening. Opening pattern variations may have characteristics, such as:
 a) Slots that do not overlap or overlap somewhat: the resulting display has un-deformed islands resulting in more uniform compliance but less overall compliance. The outcome is better display quality.
 b) Slots overlap strongly: the resulting display has few or ono islands resulting in more compliance in one direction.
 c) Slots overlap strongly and plastic deformation: the resulting display has limited compliance in both directions.
 d) Opening pattern makes part of display to turn out from plane in one direction, other part in the opposite direction—the resulting display has a possibility of special effects.
 e) Opening pattern is imparted between islands of non-stretchable areas: the resulting display has limited stretchability in one or both directions; the resulting display is a segmented display having alternating areas that either do or do not stretch.

Regarding item d) above, one may have some pixels turn slightly in one direction and other pixels turn slightly in the opposite direction and display different pictures on using the different sets of pixels. Viewers of the screen will see different pictures depending on vantage points.

Figure 9A:
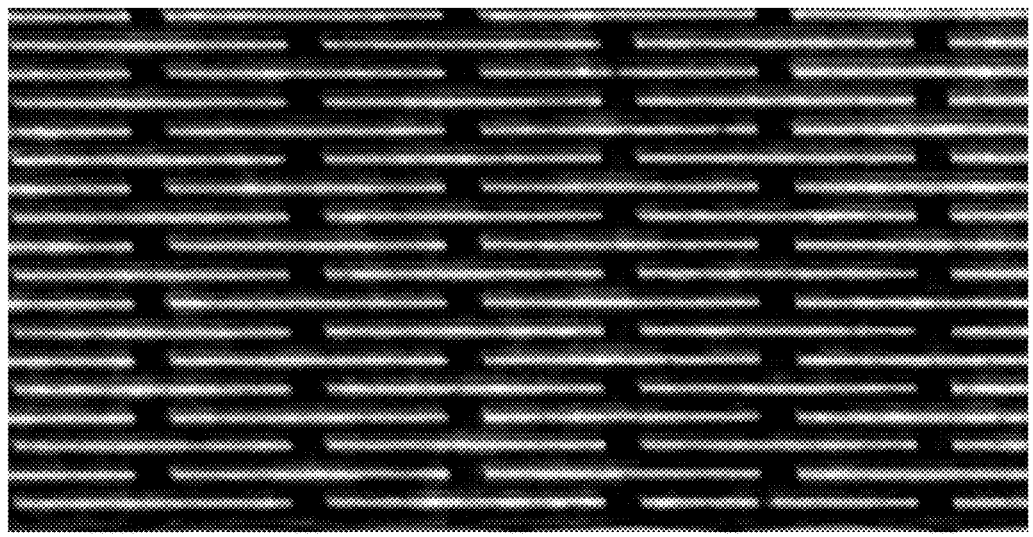
FIG. 9A is a photograph of an experimental slot pattern design imparted in a plastic sheet, wherein the sheet is flat.
Figure 9B:
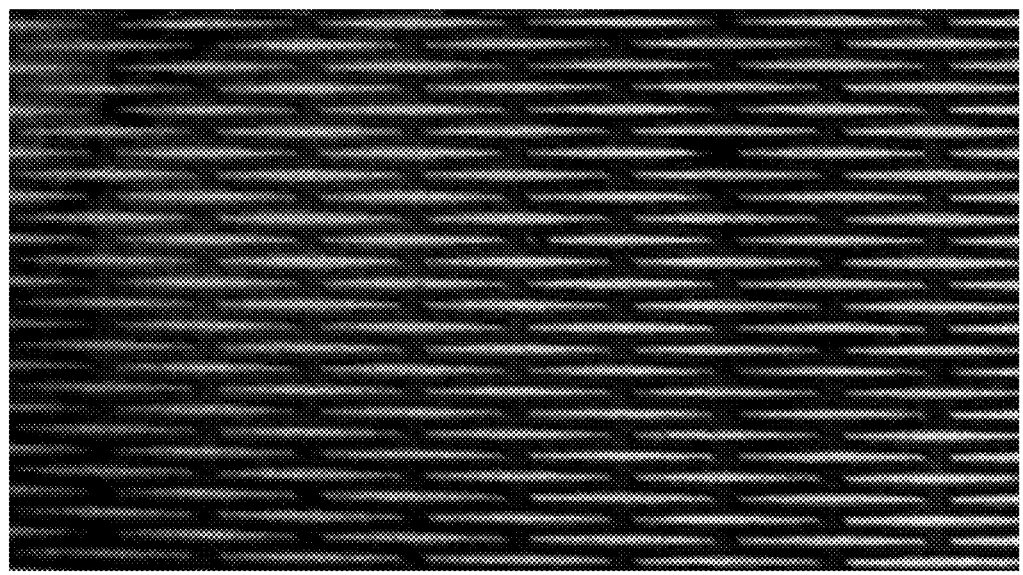
FIG. 9B is a photograph of the experimental slot pattern of FIG. 9A when deformed using a hemispherical object.
Figure 9C:
FIG. 9C is a photograph of the experimental slot pattern of FIGS. 9A and 9B when deformed by hand.

FIG. 9A and FIG. 9B are photographs of a slot pattern cut in material that is similar to that of a flexible display (organic light-emitting diode [OLED]) material both with regard to its mechanical properties and its thickness. Slot pattern was imparted by laser cutting; in the photographs the slots appear as light areas. In FIG. 9A the sheet material is flat and not deformed. In FIG. 9B the sheet material is shown deformed by using a hemispherical object. The staggered slot patterned sheet complies well with the hemispherical object due to the fact that the slots are opened up. The photograph of FIG. 9C shows the compliant deformation of the material with the slot pattern shown in FIG. 9A and FIG. 9B when the material is handled by hand. Other staggered slot patterns were tested with a variety of slot dimensions and most showed less compliance and instead of slots opening up, the sheet material developed wrinkles. Hence, the optimization of the slot pattern is important for making the best compliant electronic devices according to the present invention.

Figure 10A:
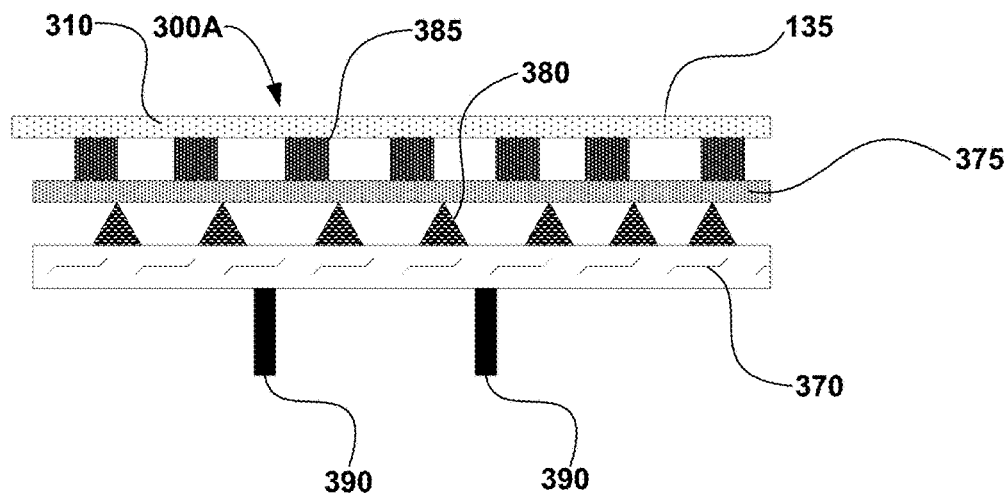
FIG. 10A is a schematic representation of the cross section of the inventive device at an intermediate stage of its production, wherein electronic components have been assembled on compliant sheets.

FIG. 10A is a schematic cross section of an intermediate component 300A of the inventive compliant device; here the device is a touchable display similar to that shown in FIG. 2 or FIG. 6. The openings similar to 160 in FIG. 2 or to 260 in FIG. 6 are not shown here. A major difference between devices 150 of FIG. 2 and 200 of FIG. 6 on the one hand and intermediate component 300A on the other hand is that in the phase of production illustrated foam layers 125 or 225 are not in place yet. On patterned and flexible boards 370 and 375 electronic devices 380 and 385 are assembled; these devices may serve a variety of purposes. Showing two flexible boards and two kinds of electronic devices is for the convenience of illustration only; those familiar with the art of designing flexible electronics will recognize that in practice a single board may in some cases suffice and that in practice a larger variety of electronic components are commonly employed in such devices. Intermediate component 300A shown in FIG. 10A is a display and therefore it comprises touchable screen 310 with touchable surface 135. Further, it also comprises electronic leads 390 (two such leads are shown). Once again, those familiar with electronics will recognize that more than two leads may be used in a practical embodiment of such a device.

Figure 10B:
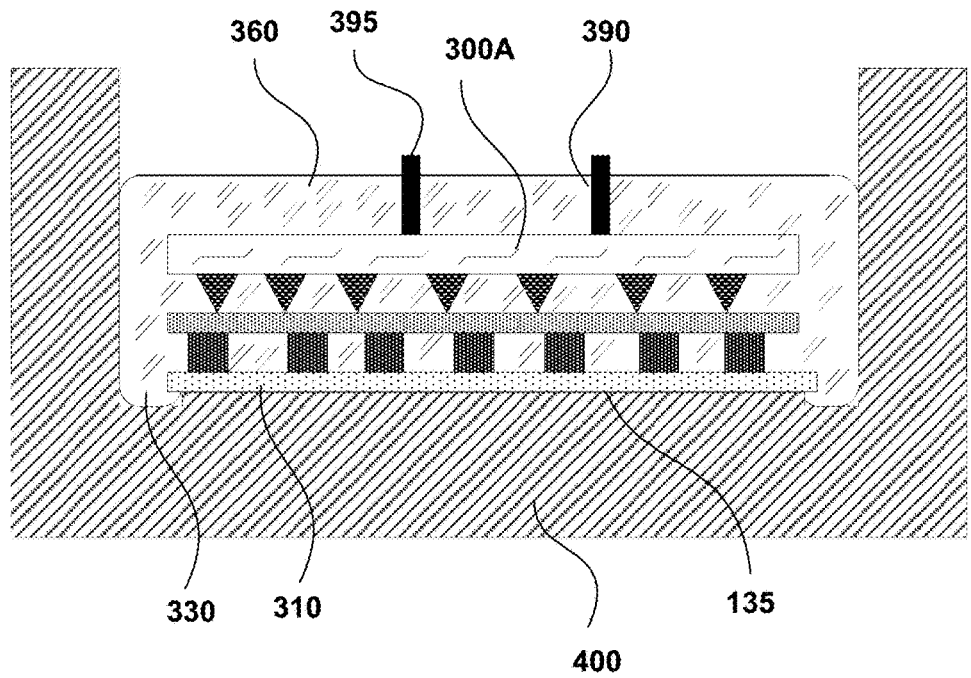
FIG. 10B is a schematic representation of the polyurethane molding of the device.

FIG. 10B shows a subsequent step in the production of the inventive compliant electronic device. Intermediate component 300A is placed "upside down" in mold 400 such that touchable surface 135 is resting on the mold surface and the mold is filled up with polyurethane foam 360. Note that the mold provides for edge 330 to be formed around screen 310 and for leaving ends 395 of electrical contacts 390 exposed. Note that even as polyurethane foam is mentioned as the insulating material that is used to make the inventive device, it is meant only as an exemplary material and other highly elastic insulating polymers may be used instead.

Figure 10C:
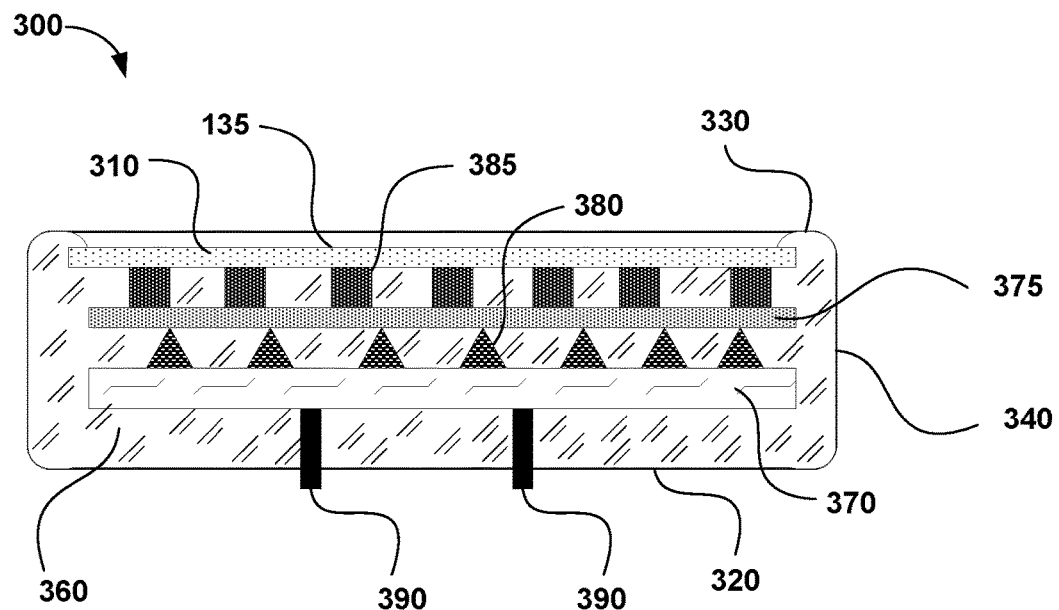
FIG. 10C is a schematic representation of the cross sectional view of the finished device.
Figure 10D:
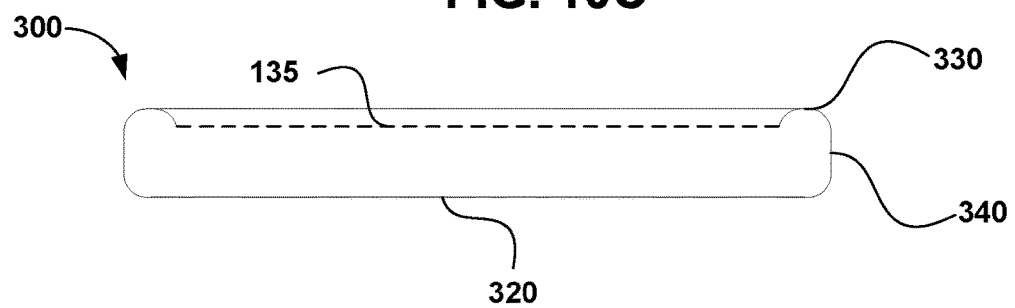
FIG. 10D is a schematic representation of the side view of the finished device.
Figure 10E:
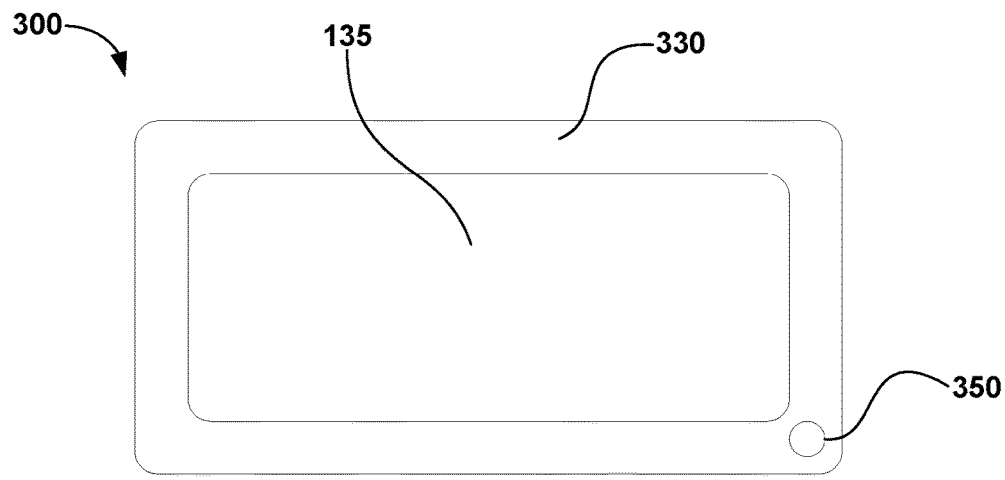
FIG. 10E is a schematic representation of the top view of the finished device.

FIG. 10C is a schematic representation of the cross section of the finished device 300. Device 300 is delimited by touchscreen surface 135 surrounded by edges 330, sides 340 and back side 320. FIG. 10D is a side view of device 300 and FIG. 10E is a top view of device 300. An exemplary user interface button is shown as button 350.

According to another preferred embodiment hereof, the present invention provides a method for producing flexible electronic devices. This process is illustrated by FIGS. 10 A to 10 E. Such inventive method accordingly may be broken down into the following steps:
  a) Compliant circuit boards are provided with additional slots/openings patterned for compliance on flexible circuit boards (flexible circuit boards may be made compliant this way); see FIG. 10A;
  b) distributed elements of electronics are attached to the compliant circuit boards; see FIG. 10A;
  c) distributed elements of optics and electro-optics are attached to the compliant circuit boards as necessary for the particular application; these elements may form displays, touchscreens, batteries, etc.; see FIG. 10 A;
  d) distributed electromechanical and/or electroacoustic elements are attached to the compliant circuit boards as necessary for the particular application; see FIG. 10A;
  e) electronic connections are provided in form of leads and sockets and other coupling elements that reach the edge or edges of the intended device; see FIG. 10A;
  f) elements that are unavoidably rigid (e.g., GPS antennas, control buttons, radio transceivers, non-distributed batteries) are attached either externally using wire connections or internally next to an edge of the otherwise compliant device; see FIGS. 10A and 10D;
  g) the entire preassembled device produced in steps a) to f) above is placed in a mold (open or closed) that has the shape of the finished device; see FIG. 10B;
  h) the mold is filled up with reactants that form polyurethane, or foam, self-skinning foam, or other appropriate material (polymer) that by virtue of its softness and other mechanical, electrical, optical, and surface properties is suitable for insulating the device from unwanted environmental effects while preserving its compliance; see FIG. 10B;
  i) the thickness of the mold varies between 0 mm and a few mm depending on the area of the device: displays and electrical connection surfaces may not be covered by polymer, optical and mechanical elements, like LEDs and buttons are covered by thin (typically submillimeter thick) layers such that they may be visible and/or may be actuated through the embedding polymer; see FIG. 10B.

In items b), c), and d) above "attached" may mean that electronic elements are created using thin film electronics technology, including, for example, using vacuum deposition, plasma etching, photoresist and other well-known processes.

Step h) also makes the device rugged. While the device is flexed, or bended, it deforms as if it were a single piece. The end result is a device that is substantially fully embedded in polymer; see FIGS. 10C, 10D and 10E.

Figure 11A:
FIG. 11A is a photograph of an undeformed mockup device similar to that shown schematically in FIG. 10A and FIG. 10B.
Figure 11B:
FIG. 11B is a photograph of the mockup device shown in FIG. 11A when deformed by hand.

Mockup devices produced following some of the steps described above (but without electronic components) were manufactured and photographs taken as shown FIG. 11A and FIG. 11B to demonstrate size, shape, and compliance. FIG. 11A is a photograph of such a mockup device held in hand without being flexed or deformed. Note that the mockup device is about 3 mm thick, 75 mm long and 50 mm wide. FIG. 11B is a photograph of the same mockup device shown in FIG. 11A flexed and twisted by hand.

Compliant displays for clothing would have to have a pitch size (distance between neighboring LEDs) of a few tenths of a millimeter for high resolution. The thickness of an OLED based display is in the same range (about 0.3 mm for some commercially available displays).

Figure 12A:
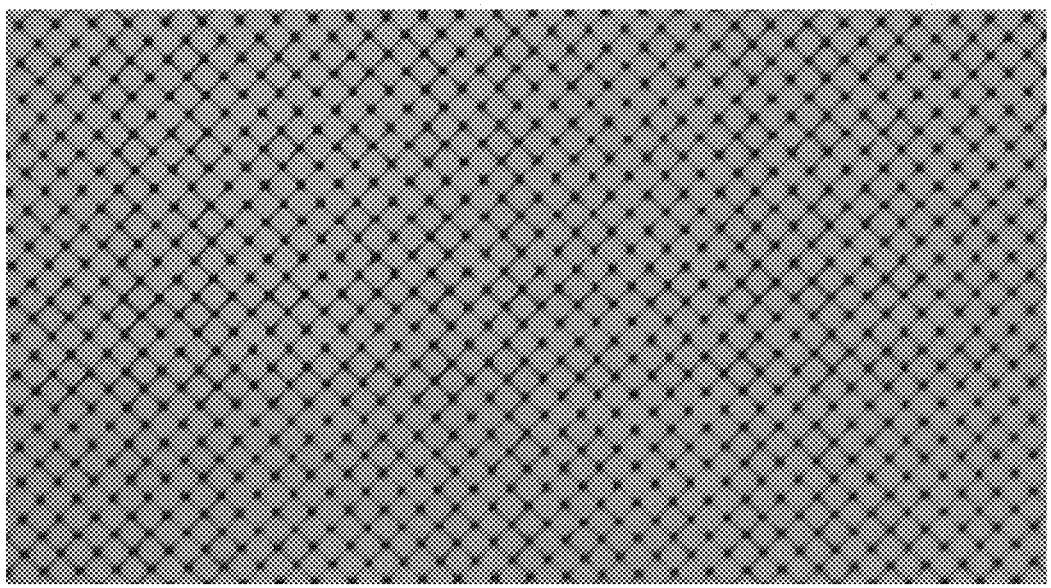
FIG. 12A is a photograph of a transparent sheet with an exemplary pattern that may be imparted into a flexible display according to an embodiment of the present invention.
Figure 12B:
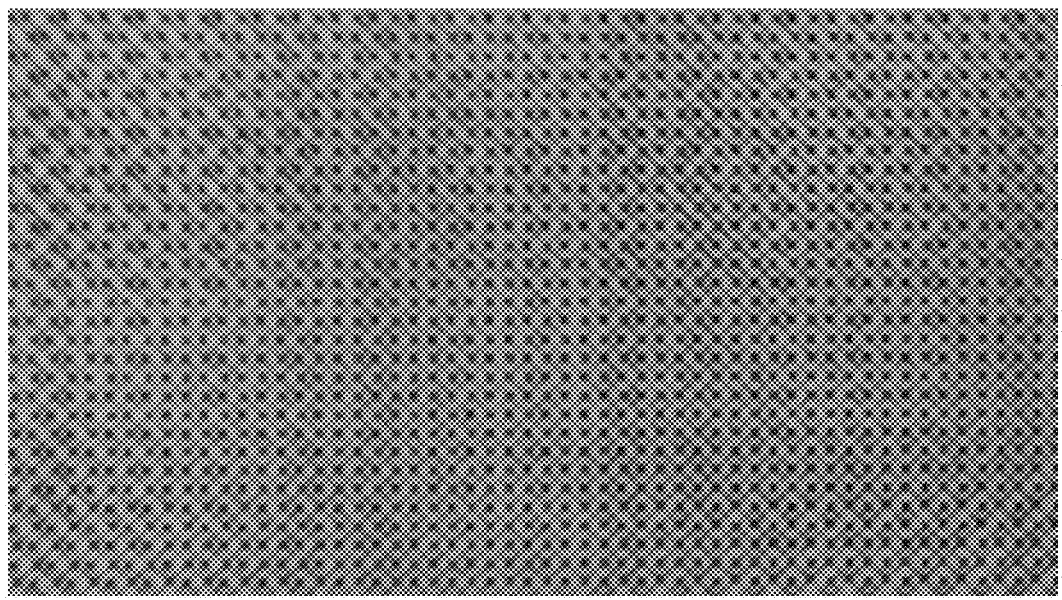
FIG. 12B is a photograph of two transparent sheets of the kind shown in FIG. 12A, wherein the sheets are shifted by about half pixel size relative to each other.

There is considerable advantage in making the openings such as 160 in FIG. 2 or 260 in FIG. 6 moderately large. The difficulty is that such an approach leads to low pixel density, possibly exceeding the 0.3 mm pitch size quoted above. A solution to this problem, according to a preferred embodiment of this invention is to use two display sheets with pixels located alternatingly on them. FIG. 12A shows a model of a pattern of openings for making the inventive compliant electronic devices, wherein the openings of the display sheet exceed the pixel size (dark square areas). Used by itself, the pixel density of such a display would be insufficient to provide a good quality picture. According to a preferred embodiment of the invention hereof, a second display sheet is provided, on which the pixels are shifted by about half the pitch size relative to the pixels on the first sheet. The shifted double sheet pattern is shown in FIG. 12B wherein the pixels density (dark squares) is doubled compared to the single sheet of FIG. 12A because pixels are visible from both display sheets.

Figure 13:
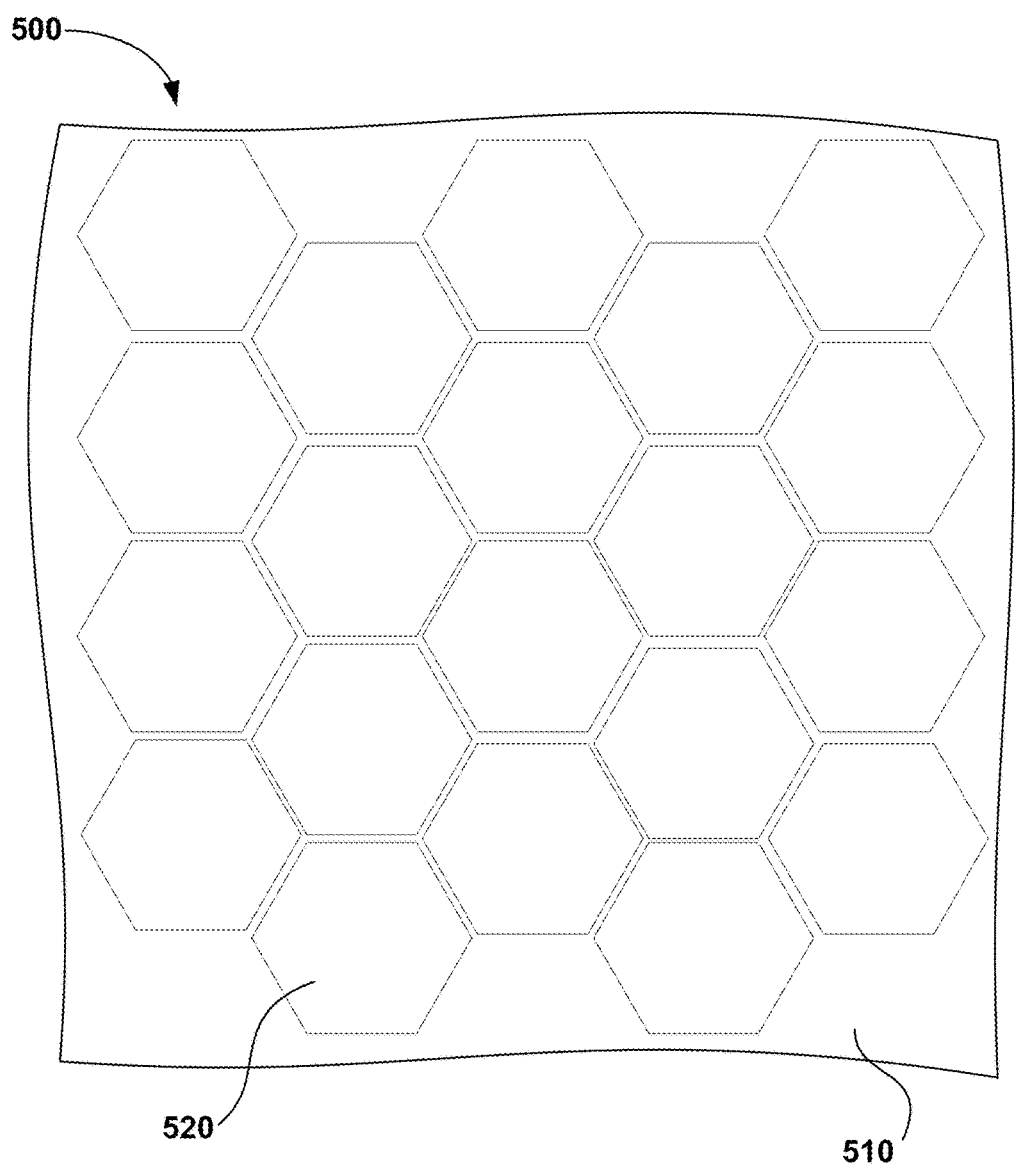
FIG. 13 shows an alternative embodiment of a compliant display according to a preferred embodiment of the present invention wherein the compliant display is constructed as an array of hexagonal patches.
Figure 14:
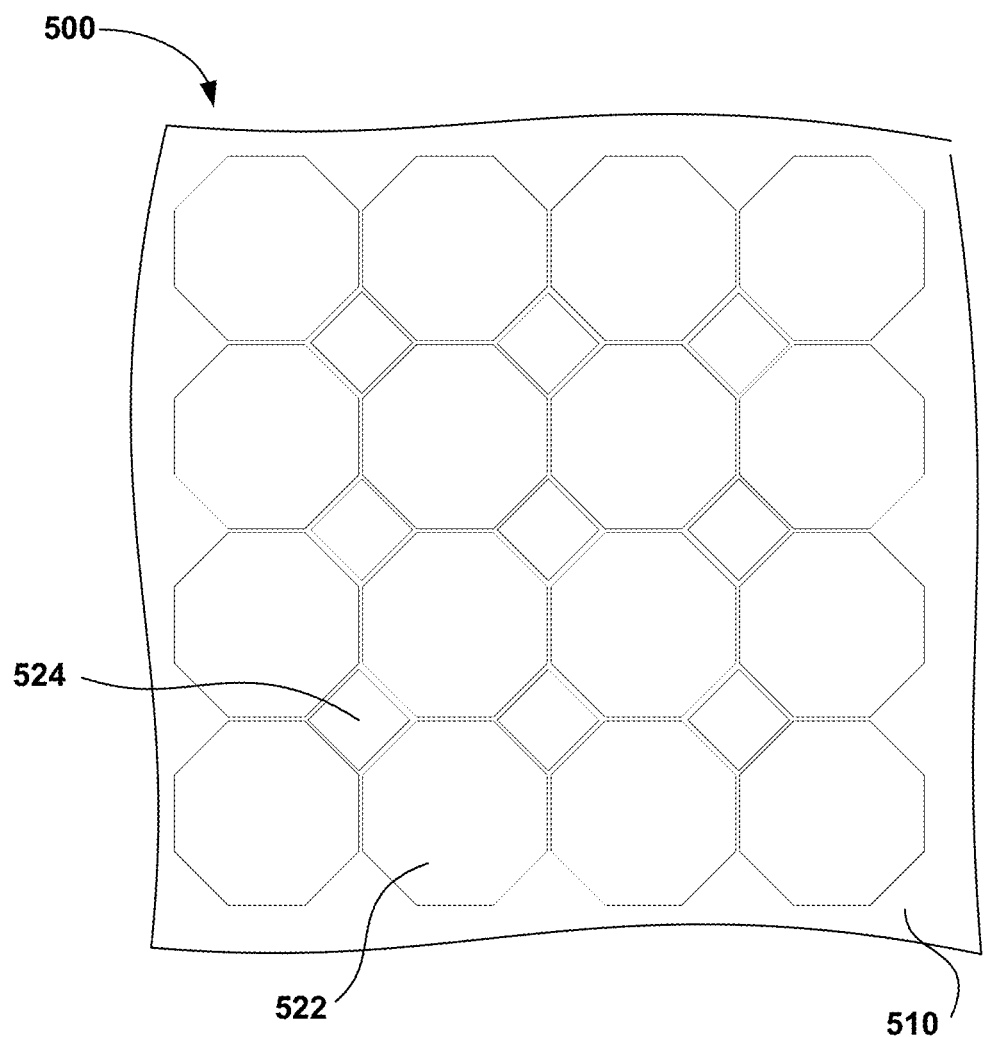
FIG. 14 shows an alternative embodiment of a compliant display according to a preferred embodiment of the present invention wherein the compliant display is constructed as an array of octagonal and square shaped patches.

FIG. 13 shows an alternative embodiment of the present invention wherein compliant display 500 is constructed as an array of hexagonal patches 520 of about a few mm linear dimension each. The patches are mounted on backing 510; backing 510 may be made of woven material (such as cloth) of about 0.1 mm thickness. The distance between the patches should not be much smaller than the thickness of the patches. Preferably, the distances between the patches should be no less than 1/10 the thickness of the patches. Patches 520 are flexible but more importantly, each connection line between the patches is an area where bending can occur easily along the dividing line between the patches. The array of patches creates a honeycomb pattern. The wiring for power and for addressing pixels may be woven into the cloth backing or may simply run on top of it. Battery power (if not incorporated into the display as in the embodiment of FIG. 5), a CPU for controlling the display, and a transceiver for radio (Internet) connection are provided in a box that is either attached to one edge of the cloth backing or is connected using a flexible (flat) wire bundle to the display but is separate in the sense that it is not worn but rather carried in a pocket or attached to the clothing of the user, or to the body of the user. The patch display 500 is the wearable electronic device. Alternative embodiments may be constructed using the principles described herein using the example of the honeycomb pattern. The common element is that patches must cover the surface completely and the bendability along the edges of the patches must be utilized in at least three directions. For example, triangular patches may be employed. Also a pattern made of the combination of octagons and squares could be used, as shown in FIG. 14. In FIG. 14, the compliant display is constructed as an array of octagonal patches 522 and square shaped patches 524 on backing 510.

In accordance with a preferred embodiment hereof, this invention provides a woven display assembly for electronic devices comprising a flexible frame and two sets of stretchable displays, wherein each set comprises a multiplicity of stretchable display strands, and wherein said strands are at least one pitch size in width and have the length when not stretched to connect opposite sides of said frame and are interwoven with one another, and wherein said strands constitute a quasi-continuous display surface within said frame.

Alternative embodiments of the invention also include a compliant display for electronic devices comprising a top side and a bottom side, a bendable substrate between said top side and bottom side with light emitters and other electronic parts attached to said substrate, wherein said light emitters constitute a pixelated display, and wherein said bottom side is characterized by the ability to stick to surfaces due to its mechanical, chemical, or electromagnetic properties. The compliant display may also comprise a layer within the display that is made of a pliant material that causes the display to retain a shape to which it is bent. In some embodiments the pliant material may be a shape memory alloy in the martensitic state. In addition, in some embodiments the bendable display further comprises heating elements that can cause the shape memory alloy to return to its original shape.

In yet another embodiment, the inventive compliant display comprises at least one layer made of piezoelectric material and an array of pixel-size electrical components that can cause the piezoelectric material to bend the display in a particular programmable shape or the array of pixel-size electrical components that sense the local strain of the piezoelectric layer when the display is bent from its original shape.

In a preferred embodiment hereof the inventive device is a stretchable display for an electronic device comprising a bendable display having a top side and a bottom side, a multiplicity of regularly arranged pixel size light emitting electronic devices attached to a flexible substrate and located between said top side and bottom side that contribute to a picture visible from the top side and a multiplicity of commensurate size and regularly arranged openings connecting said top side and said bottom side. The shapes of said openings are optimized to minimize the strain when said display is deformed from its original shape. The original shape of the stretchable display is substantially flat. In an alternative embodiment the original shape of the stretchable display is substantially a cap portion of an ellipsoid. In yet another embodiment of the invention the original shape of the display is substantially cylindrical.

In a preferred embodiment hereof the inventive stretchable display has a bottom side comprised of a material that sticks to a fabric or to a magnetic material. In another embodiment the bottom side of the inventive display is comprised of a material that clings to a smooth surface.

In a preferred embodiment hereof in the inventive stretchable display the locations of the nearest neighbor light emitting electronic devices that constitute the pixels form squares. In another embodiment of the invention the locations of the nearest neighbor light emitting electronic devices that constitute the pixels form rectangles.

In a preferred embodiment hereof the openings in the inventive stretchable display are slots with a length to width ratio exceeding 2 to 1. When the slots are not substantially squares, they have a length and a width that also define a "length direction" (as opposed to a width direction). In a preferred embodiment of the inventive device the slots are arranged such that the length direction of all slots is the same when the display is not deformed. In an alternative embodiment of the invention the slots are arranged such that the length directions of adjacent slots are perpendicular. In yet another embodiment of the invention the slots are arranged such that the length directions constitute a patchwork wherein each said patch has a directionality because within each patch the lengths of all slots are oriented in the same direction, and adjacent patches have different directionalities. In yet another embodiment of the invention the openings are substantially rectangular.

In yet another preferred embodiment of the invention the inventive device is a woven display assembly for electronic devices comprising a flexible frame and two sets of stretchable displays, wherein each set comprises a multiplicity of stretchable display strands, and wherein said strands are one or several pitch size in width and have the length when not stretched to connect opposite sides of said frame and are interwoven with one another, and wherein said strands constitute a quasi-continuous display surface within said frame. The woven display assembly may have a design wherein each strand has the same width and wherein the frame is substantially rectangular.

In yet another embodiment hereof the inventive device is a wearable electronic device wherein said device comprises a patchwork of substantially flat electronic devices as patches and wherein said patches are attached to a cloth-like backing and interconnected by wiring that runs along said backing and wherein the patches have borders that define their shapes and are shaped such that they fill up a plane and such that the borders are oriented in at least three substantially different directions. The patches are further characterized by having a thickness and the distances between the patches as they are attached to the backing are preferably about the same as the thicknesses of the patches. The patches preferably are shaped hexagonally; in such an arrangement all patches may be identical by size. The patches next to the edges of the display may or may not have the same shape. In an alternative embodiment of the invention alternating octagonal and square shaped patches may be employed.

Different embodiments, features and methods of the invention are described with the aid of the figures, however the particular described embodiments, features and methods should not be construed as being the only ones that constitute the practice of the invention and the described embodiments, features and methods are in no way substitutes for the broadest interpretation of the invention as claimed.

What is claimed is:

1. A compliant electronic device comprising:
    a substrate having a top side and a bottom side, said substrate made of flexible material and said substrate having an array of openings that extend from said top side to said bottom side and comprising an array of electronic parts attached to said substrate in the areas between said array of openings;
    an insulating member having a top side and a bottom side, wherein said insulating member fills in gaps between the electronic parts and wherein said insulating member is made of stretchable and compressible material; and
    a display screen is attached to the top side of said insulating member and wherein said display screen has a top side and a bottom side and also comprises an array of regularly arranged openings that extend from said top side to said bottom side.

2. The compliant electronic device of claim 1, comprising a second substrate having a top side and a bottom side, said second substrate being made of flexible material and said second substrate having an array of openings that extend from said top side to said bottom side and comprising an array of electronic parts attached to said second substrate in the areas between said array of openings.

3. The compliant electronic device of claim 2, wherein one substrate is made of piezoelectric material and the array of electronic parts can cause the piezoelectric material to locally bend the device in a particular programmable shape.

4. The compliant electronic device of claim 2, wherein a substrate is made of piezoelectric material and the array of electronic parts can detect any local strain of the piezoelectric substrate.

5. The compliant electronic device of claim 2, wherein the electronic devices attached to one of the substrates are pixel size rechargeable batteries.

6. The compliant electronic device of claim 2, wherein said device has a top surface and a bottom surface, said surfaces being substantially parallel and their distance of separation being small compared to the sizes of said top surface and bottom surface and wherein said top surface and said bottom surface are formed by a highly stretchable and compressible polymer that fills up substantially the space between said top surface and said bottom surface.

7. The compliant electronic device of claim 2, wherein said device has a top surface and a bottom surface, said surfaces being substantially parallel and their distance of separation being small compared to the sizes of said top surface and bottom surface and wherein said top surface comprises a display screen and said bottom surface is formed by a highly stretchable and compressible polymer that fills up substantially the space between said top surface and said bottom surface.

8. The compliant electronic device of claim 1, wherein said device has a top surface and a bottom surface, said surfaces being substantially parallel and their distance of separation being small compared to the sizes of said top surface and bottom surface and wherein said top surface and said bottom surface are formed by a highly stretchable and compressible polymer that fills up substantially the space between said top surface and said bottom surface.

9. The compliant electronic device of claim 1, wherein said device has a top surface and a bottom surface, said surfaces being substantially parallel and their distance of separation being small compared to the sizes of said top surface and bottom surface and wherein said top surface comprises a display screen and said bottom surface is formed by a highly stretchable and compressible polymer that fills up substantially the space between said top surface and said bottom surface.

10. A stretchable display for an electronic device comprising a bendable substrate having a top side and a bottom side, a multiplicity of regularly arranged pixel size light emitting electronic devices attached to said bendable substrate and located between said top side and bottom side, wherein said light emitting electronic devices constitute pixels of a picture visible from the top side and a multiplicity of regularly arranged openings connecting said top side and said bottom side; and said regularly arranged openings are made in a staggered slot pattern.

11. The stretchable display of claim 10, comprising two bendable substrates, wherein the nearest neighbor light emitting electronic devices attached to each of said bendable substrates form squares and wherein the light emitting devices on said two bendable substrates in combination form a pixel arrangement wherein the nearest neighbor pixels are located at the vertexes of squares.

12. The stretchable display of claim 10, comprising two bendable substrates, wherein the nearest neighbor light emitting electronic devices attached to each of said bendable substrates form rectangles and wherein said rectangles have a short side and a long side and wherein the long side is about twice as long as the short side and wherein the light emitting devices on said two bendable substrates in combination form a pixel arrangement wherein the nearest neighbor pixels are located at the vertices of squares.

* * * * *